United States Patent
Laureanti

[11] Patent Number: 6,111,464
[45] Date of Patent: Aug. 29, 2000

[54] AMPLIFIER HAVING BIAS CIRCUIT SELF-COMPENSATING FOR VGS PROCESS VARIATION AND IDS AGING

[75] Inventor: Steven J. Laureanti, Lewisville, Tex.

[73] Assignee: Nokia Networks Oy, Espoo, Finland

[21] Appl. No.: 09/361,036

[22] Filed: Jul. 23, 1999

[51] Int. Cl.[7] .................................................. H03F 3/26
[52] U.S. Cl. ........................ 330/269; 330/267; 330/270
[58] Field of Search ............................ 330/264, 265, 330/267, 269, 270, 273

[56] References Cited

U.S. PATENT DOCUMENTS

| | | | |
|---|---|---|---|
| 4,963,837 | 10/1990 | Dedic | 330/264 |
| 5,055,796 | 10/1991 | Schaffer | 330/264 |
| 5,973,564 | 10/1999 | Ivanov | 330/265 |

Primary Examiner—Robert Pascal
Assistant Examiner—Patricia T. Nguyen
Attorney, Agent, or Firm—Steven K. Barton; Holland & Hart LLP

[57] ABSTRACT

An LDMOS RF amplifier having a bias voltage generated through feedback around an LDMOS sense transistor has a sense transistor, a current sensing circuit that monitors current in the sense transistor, and a bias voltage generation circuit controlled by an output of the current sensing circuit. The bias voltage from the bias voltage generation circuit is applied to the gates of both the sense transistor and an LDMOS RF power amplifier transistor. An AC-coupled RF input signal is applied through typical impedance-matching circuitry to the gate of the RF power amplifier transistor, and an AC-coupled output signal is tapped from, and power applied to, the drain of the RF power amplifier transistor through impedance matching circuitry of the type known in the art.

17 Claims, 4 Drawing Sheets

AMPLIFIER HAVING BIAS CIRCUIT SELF-COMPENSATING FOR VGS PROCESS VARIATION AND IDS AGING

FIELD OF THE INVENTION

The present invention relates to gate biasing circuits for use in biasing MOS power devices in AC-coupled amplifiers. The invention is particularly useful for use with LDMOS transistors in RF amplifiers.

BACKGROUND OF THE INVENTION

Modern RF LDMOS transistors are usable as the active device in RF power amplifiers operating at frequencies over a range from below 1 MHz up to more than 2 GHz; including the 900 MHz and 1.8 MHz bands used by cellular telephones. For example, the Motorola MRF282SR1 is rated to produce about 10 watts at up to 2 GHz when operated class A or class AB and the Motorola MRF21120 is rated to produce 120 watts in the same frequency range when operated class AB.

LDMOS RF power devices are typically N-channel enhancement mode MOS field effect transistors.

RF amplifiers using these LDMOS devices typically have an impedance matching and input coupling circuit that couples an input RF signal from an input terminal of the amplifier to the gate of the LDMOS device while providing DC isolation between the input terminal and the gate. They typically also have an impedance matching and output coupling circuit that extracts an output RF signal from the drain of the LDMOS device to the output terminal of the amplifier device, while providing DC isolation between the output terminal and the drain and providing a path for power to the drain.

RF amplifiers using these LDMOS devices typically also have a gate bias circuit that provides a DC component, or gate bias, to the gate voltage of the device. For Class A or Class AB operation, this gate bias voltage is selected such that with no RF input the LDMOS device conducts a desired quiescent current between its drain and source terminals.

LDMOS RF power devices have gate threshold voltages that are temperature dependent as well as subject to process variation. The bias voltage for operation at a constant quiescent current in a Class AB RF amplifier is therefore both temperature dependent and unique for each device. For example, the Motorola MRF282SR1 is specified to have a gate threshold voltage in the range of 2 to 4 volts, and to require a bias voltage during Class AB operation of somewhere between 3 and 5 volts in order to maintain proper quiescent current. Similarly, the MRF282SR1 requires a bias voltage of between 3 and 5 volts for Class A operation, where the bias required for Class A operation is greater than that for Class AB operation. For details of the MRF282SR1 please see the data sheet MRF282/D available from Motorola's Semiconductor Products Sector.

Prior-art biasing circuits use a resistive voltage divider, implemented as a potentiometer or a pair of well-chosen resistors, to set the bias voltage for the LDMOS transistor. These circuits may utilize either a forward-biased diode or a thermistor to provide temperature compensation.

With resistive divider bias circuits an adjustment step is needed during manufacture of the RF amplifiers. This adjustment step sets the ratio of resistances such that the generated bias voltage gives proper quiescent current for the specific LDMOS transistor.

In Class AB amplifiers comprising a pair of LDMOS devices, this resistor ratio should ideally be set separately for each device of the pair so that the bias voltage produces proper quiescent current in each device. Alternatively, extra quiescent current may be carried to ensure linear operation despite minor variations in device characteristics.

As an LDMOS RF transistor ages, it is subject to hot-electron degradation. For N-type LDMOS devices, hot electron degradation causes an increase in the bias voltage required to maintain a constant quiescent current.

In amplifiers having resistive divider bias circuits, as the LDMOS power transistor ages hot electron degradation will cause quiescent current to fall off with time unless the bias circuit resistor ratio is readjusted. This falling-off of quiescent current may exceed ten percent. Prior amplifiers have required adjustment or have carried extra quiescent current so as to provide margin for hot-electron degradation. This extra quiescent current is undesirable as it causes inefficiency and thereby harms the environment.

It is advantageous to have a bias circuit that does not require adjustment to compensate for process variation or for hot-electron degradation over the life of the amplifier.

Most LDMOS RF power transistors are made as a plurality of smaller transistors, or cells, all fabricated on the same die but linked electrically in parallel. Each cell has a source, a gate, and a drain.

It is known in the art that transistors of the same type and dimensions fabricated together on the same die have similar initial device characteristics, thereby forming a matched pair. Similarly, ratioed matched pairs, or pairs of devices having similar gate threshold voltages but having drain currents differing by a known ratio N/M, are commonly built by paralleling N cells for a first device in the pair and M cells in the second device of the pair.

It is also known that with a ratioed matched pair fabricated on the same die and operating at the same drain voltage, not only are initial gate thresholds similar and the quiescent currents held to ratioed values, but the temperature and thermal coefficients and hot-electron aging characteristics of the devices tend to matched as well.

SUMMARY OF THE INVENTION

It has been found that a bias voltage for an LDMOS sense transistor may be generated by using a feedback-controlled bias circuit to maintain a constant current. This bias voltage may be applied to an LDMOS RF power transistor collocated on the same die as the LDMOS sense power transistor.

When the LDMOS sense transistor and LDMOS RF power transistor are operated at the same or a similar drain voltage, a bias voltage generated in this way provides good control of quiescent currents in the LDMOS RF power transistor over a wide range of temperatures without requiring adjustments to compensate for process variation or hot-electron aging in the LDMOS RF power transistor.

An LDMOS RF amplifier having a bias voltage generated through feedback around an LDMOS sense transistor has a sense transistor, a current sensing circuit that monitors current in the sense transistor, and a bias voltage generation circuit controlled by an output of the current sensing circuit. The bias voltage from the bias voltage generation circuit is applied to the gates of both the sense transistor and an LDMOS RF power amplifier transistor. An AC-coupled RF input signal is applied through typical impedance-matching circuitry to the gate of the RF power amplifier transistor, and an AC-coupled output signal is tapped from, and power applied to, the drain of the RF power amplifier transistor through impedance matching circuitry of the type known in the art.

DETAILED DESCRIPTION OF THE PREFERRED EMBODIMENTS

Figure 1:
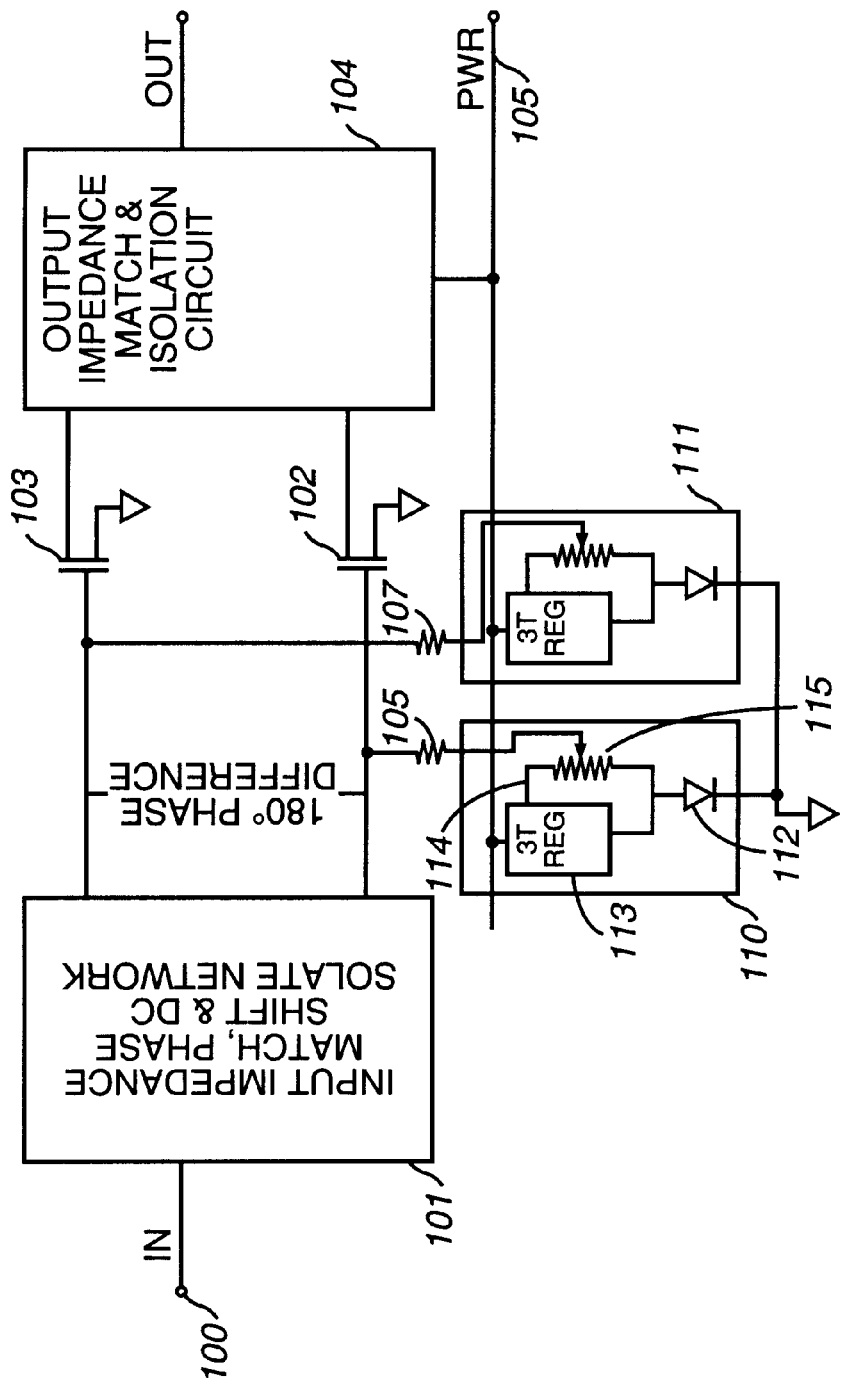
FIG. 1 is a schematic of a prior art class AB amplifier using an LDMOS transistor.

FIG. 1 shows an LDMOS Class-AB RF amplifier of typical prior art design. This amplifier has a bias circuit similar to that proposed in Motorola application note AN1643/D. RF energy enters this amplifier through an input terminal 100 into an input impedance matching, phase shifting, and DC-isolation circuit 101.

Many forms of this input impedance matching, phase shifting, and DC-isolation circuit 101 are known in the art. At low frequencies torroidal transformers may be used. At higher frequencies microstripline circuitry is common. This circuit may include resonant circuits if narrow-band operation is desired.

The input impedance matching, phase shifting, and DC-isolation circuit 101 provides an AC component to the gates of LDMOS power transistors 102 and 103 such that the AC component at the gate of LDMOS power transistor 102 is one hundred eighty degrees out of phase with the AC component at the gate of LDMOS power transistor 103.

An output impedance matching and isolation circuit 104 couples power from a power supply input 105 to the drains of the LDMOS power transistors 102 and 103. Many forms of this output impedance matching, phase shifting, and DC-isolation circuit 104 are known in the art. At low frequencies torroidal transformers may be used. At higher frequencies, such as 1.8 GHz digital cellular telephone frequencies, microstripline circuitry is common. This circuit may include tuned resonant circuits if narrow-band operation is desired.

Gate bias circuits 110 and 111 provide a DC bias voltage to the gates of the LDMOS power transistors 102 and 103 through a pair of AC isolation resistors 106 and 107. The bias circuit shown in FIG. 1 is similar to that proposed in Motorola application note AN1643/D. In this bias circuit, a temperature-compensation diode 112 provides a temperature-dependent reference voltage to a standard 3-terminal voltage regulator chip 113. This 3-terminal voltage regulator thereupon provides a temperature-dependent supply voltage 114 to a potentiometer 115. Potentiometer 115 provides a gate bias voltage through the AC isolation resistor 106 to the LDMOS power transistor 102. Potentiometer 115 is adjusted so that the gate bias voltage produces proper quiescent current in the LDMOS power transistor 102. Alternatively, a pair of resistors having values tailored to the characteristics of the individual amplifier transistors may replace the potentiometer; such a resistor pair may be laser-trimmed.

Figure 2:
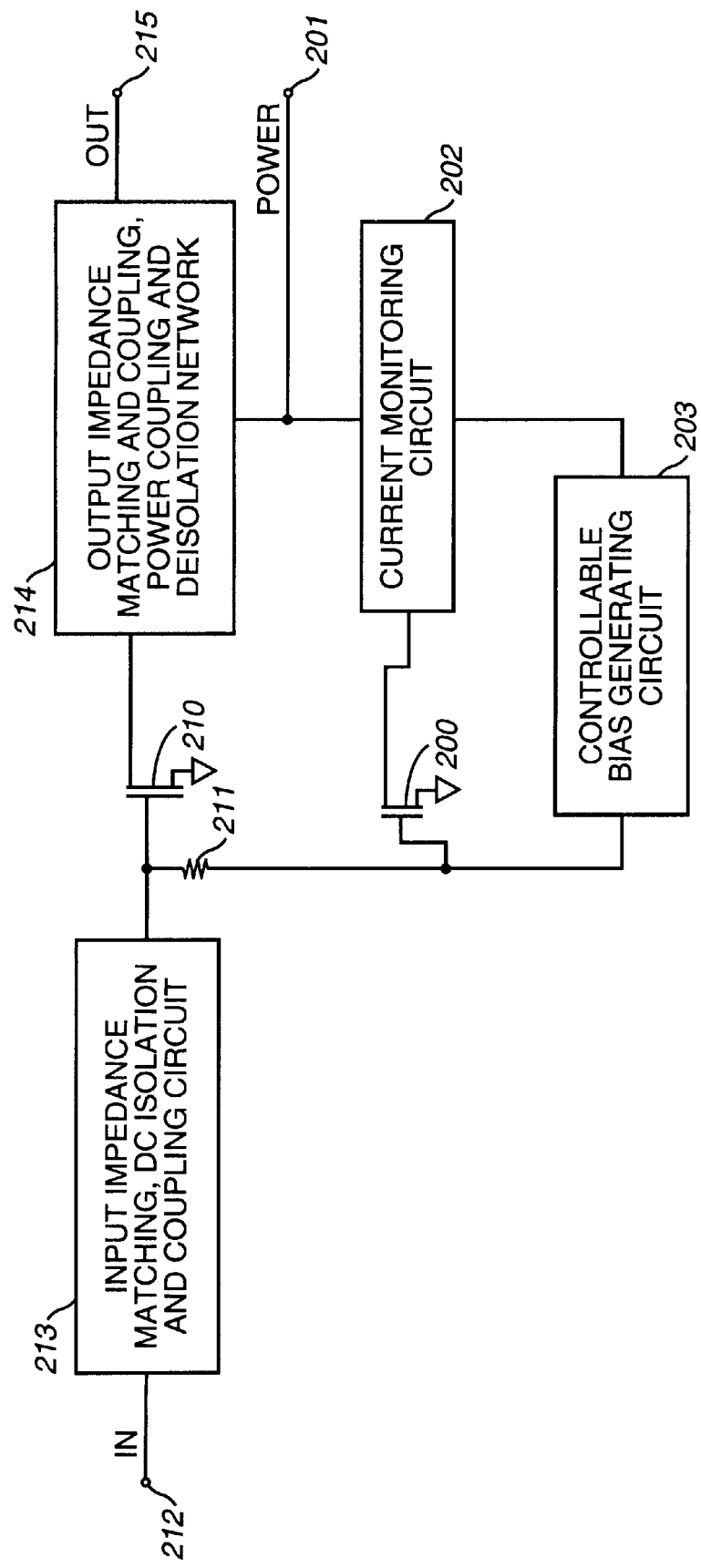
FIG. 2 a conceptual schematic of an amplifier having a sense-transistor controlled bias circuit.

FIG. 2 shows an amplifier having a sense-transistor controlled bias circuit at the conceptual block-diagram level. A sense transistor, 200, is provided. Power is supplied from the power terminal of the amplifier 201 to the sense transistor 200 through a current monitoring circuit 202. At least one output of the current monitoring circuit is applied to a controllable bias generation circuit 203, which provides bias to the sense transistor 200 and to the gate of the RF amplifier power transistor 210 through decoupling resistor 211. An AC input signal is coupled from an input of the amplifier 212 to the gate of RF amplifier transistor 210 by an input impedance-matching, DC isolation, and coupling circuit 213. Power is coupled from the power terminal of the amplifier 201 to the RF amplifier transistor 210 by an output impedance-matching and coupling, power coupling, and DC-isolation network 214. The output impedance-matching and coupling, power coupling, and DC-isolation network 214 also extracts an AC signal from the drain of the RF amplifier transistor to an output of the amplifier 215.

Figure 3:
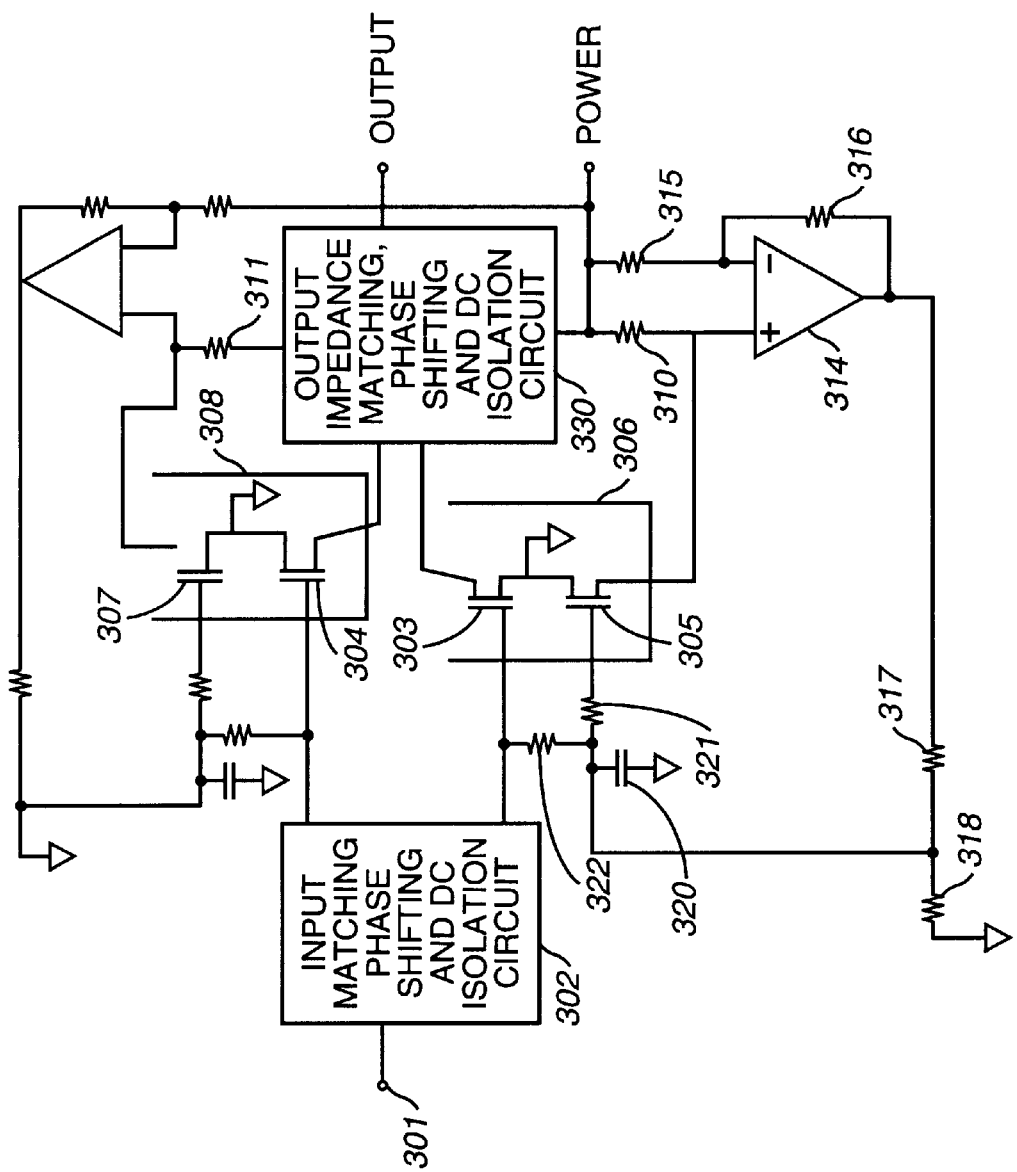
FIG. 3 a schematic of a Class AB amplifier having a sense-transistor controlled bias circuit.

FIG. 3 is a schematic of a Class-AB linear RF power amplifier embodying the present invention. This amplifier has an input terminal 301 coupled to an input matching, phase shifting, and DC-isolating circuit 302 that provides an AC component to the gate of a first LDMOS power transistor 304 and an AC component one hundred eighty degrees out of phase to the gate of a second LDMOS power transistor 304.

In this amplifier, each LDMOS power transistor is fabricated as a ratioed matched pair with an LDMOS sense transistor. The sense transistors are preferably fabricated on the same die as and designed to have the same threshold voltage as the LDMOS power transistor with which they are paired. Each LDMOS sense transistor preferably forms a ratioed matched pair with its associated LDMOS power transistor, with the sense transistor being the smaller of the two. LDMOS power transistor 303 is therefore fabricated with LDMOS sense transistor 305 as a ratioed matched pair 306. Similarly, LDMOS power transistor 304 is therefore fabricated with LDMOS sense transistor 307 as a ratioed matched pair 308.

A sensing circuit provides power to and monitors current flow through each of the LDMOS sense transistors. In the amplifier of FIG. 3, this sensing circuit comprises load resistors 310 and 311. A signal from the sensing circuit is fed to a feedback-controlled bias circuit such that the current in the LDMOS sense transistor is maintained at a constant level. In the amplifier of FIG. 3, the feedback-controlled bias circuit for ratioed matched pair 306 comprises an operational amplifier 314 and resistors 315, 316, 317, and 318. The bias voltage from the feedback-controlled bias circuit is coupled to the gates of the LDMOS RF power transistor 303 and the LDMOS sense transistor 305 of ratioed matched pair 306 by an RF decoupling circuit comprising a capacitor 320 and two resistors 321 and 322.

A similar current sensing circuit and a similar feedback-controlled bias circuit is provided for the other ratioed matched pair 308.

Power is supplied to, and RF output power is tapped from, the drains of the LDMOS RF amplifier transistors 303 and 304, by an output impedance matching, phase shifting, and DC-isolation circuit 330 similar to those known in the art.

Because the LDMOS power transistor 303 forms a ratioed matched pair with the LDMOS sense transistor 305, and the same bias voltage is applied to the LDMOS power transistor as is to the LDMOS sense transistor, the LDMOS power transistor 303 draws a fairly constant quiescent current approximately equal to the ratio of the device sizes times the current in the LDMOS sense transistor 305.

Figure 4:
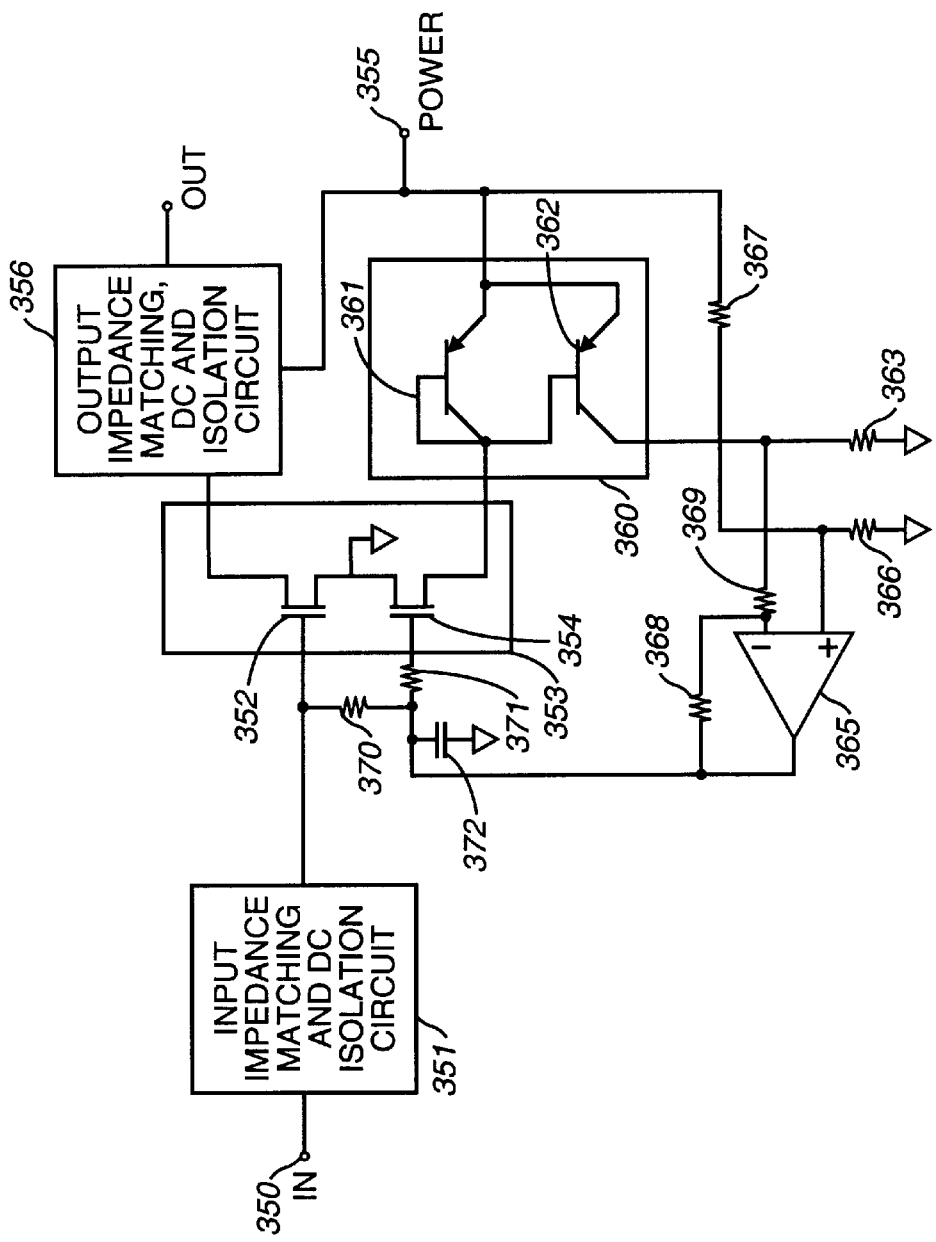
FIG. 4 a schematic of a Class A amplifier having an alternative embodiment of a sense-transistor controlled bias circuit.

In another embodiment of the invention as applied to a Class A amplifier, as portrayed in FIG. 4, the AC component of the input signal 350 is applied through an input impedance matching and DC isolation circuit 351 to the gate of an LDMOS RF power transistor 352. RF power transistor 352 is fabricated as a ratioed matched pair 353 with LDMOS sense transistor 354. A source of DC power 355 is coupled through an output impedance matching, DC supply, and isolation circuit 356 to the drain of the LDMOS RF power transistor 352.

In this embodiment of the invention, DC power is supplied to the drain of the LDMOS sense transistor 354 through a current sensing circuit. The current sensing circuit incorporates a current mirror 360 containing a matched pair of PNP transistors 361 and 362 that produce a current in a resistor 363 equal to that of the current in the sense transistor 354. Alternatively, the current mirror may contain a pair of PMOS transistors in place of the PNP transistors. The current in resistor 363 produces a voltage that is compared by an operational amplifier 365 to a reference voltage generated by a resistive divider composed of resistors 366 and 367. This operational amplifier, whose gain is set by a pair of resistors 368 and 369, forms a controllable bias generation circuit. The bias generated by the operational amplifier 365 is coupled to the gates of both the LDMOS sense transistor 354 and the LDMOS RF power amplifier transistor 352 by a DC coupling and AC isolation circuit comprising resistors 370, 371, and capacitor 372.

A class AB amplifier according to the present invention may also be constructed from a first and a second LDMOS RF power transistor both fabricated on the same die as a single LDMOS sense transistor In this embodiment, a bias voltage generated by a current monitoring circuit that monitors current in the LDMOS sense transistor, and a feedback-controlled bias circuit, is applied to the gates of both RF power transistors and the sense transistor.

The bias generation circuitry of the present invention may also be applied to amplifiers built from vertical (VMOS) transistors.

Bias circuits of the present invention may also be applied to Class B amplifiers built of LDMOS transistors by injecting a small DC offset between the gate voltage at the sense transistor and the gates of the power transistors.

Since the current through the source connection of a MOS transistor is normally equal to that through the drain, circuitry that monitors current through the source of the MOS sense transistor is equivalent for purposes of this invention to circuitry that monitors current through the drain.

Device size ratios, and hence quiescent current ratios, between the RF power amplifier transistor and the sense transistor may range from 1:1 for low power amplifiers, up to about 100:1; with ratios of between 1:20 and 1:40 preferred.

The feedback-controlled bias circuit described herein may be used with an RF power transistor and sense transistor that are not fabricated on the same die if these devices have similar device characteristics. If it is desired to use sense and power amplifier devices having dissimilar characteristics, circuitry may be provided to provide an adjustable voltage offset between the gates of the sense and power transistors to compensate for differences in gate threshold voltage.

I claim:

1. An amplifier comprising
   a) a first power transistor, having a gate and a drain;
   b) a first sense transistor, having a gate and a drain;
   c) a first current sensing circuit having an output and coupled to measure a current flow through the drain of the first sense transistor;
   d) a first bias circuit for generating a first bias voltage, the first bias voltage being coupled to the gate of the first power transistor and to the gate of the first sense transistor, the first bias circuit having a control input coupled to the output of the first current sensing circuit;
   e) circuitry for coupling an input signal to the gate of the first power transistor;
   f) circuitry for coupling an output signal from the drain of the first power transistor and for coupling power to the first power transistor; and
   g) circuitry for coupling power to the first sense transistor;
   h) wherein the first bias circuit is controlled by the output of the first current sensing circuit so as to maintain a constant current in the first sense transistor, and thereby also maintaining a substantially constant quiescent current in the first power transistor.

2. An amplifier according to claim 1, wherein the first power transistor and the first sense transistor are of the LDMOS type.

3. An amplifier according to claim 2, wherein the first power transistor and first sense transistor are fabricated on the same die.

4. An amplifier according to claim 1, further comprising:
   i) a second power transistor, having a gate and a drain;
   j) circuitry for coupling the input signal to the gate of the second power transistor, such that an AC component of a signal at the gate of the first power transistor is approximately 180 degrees out of phase with an AC component of a signal at the gate of the second power transistor;
   k) circuitry for coupling the output signal from the drain of the second power transistor and for coupling power to the second power transistor; and
   l) circuitry for coupling the bias voltage to the gate of the second power transistor.

5. An amplifier according to claim 4, wherein the first power transistor, the second power transistor, and the first sense transistor, are fabricated on the same die.

6. An amplifier according to claim 4, wherein the first bias voltage is such that the first power transistor and the second power transistor operate as class AB push-pull amplifiers.

7. A bias circuit for an RF power amplifier having an RF amplifying device, comprising
   a) a MOS sense transistor having a gate and a drain;
   b) a current sensing circuit having an output and coupled to monitor a current through the drain of the MOS sense transistor; and
   c) circuitry for generating a bias voltage as a function of the output of the current sensing circuit, the bias voltage being coupled to the gate of the MOS sense transistor, and wherein the bias voltage is automatically adjusted such that an increase in the current through the drain of the MOS sense transistor as monitored by the current sensing circuit causes a change in the bias voltage in a direction that will reduce the current through the drain of the MOS sense transistor.

8. The bias circuit for an RF power amplifier of claim 7, wherein the RF amplifying device is an MOS transistor.

9. The bias circuit for an RF power amplifier of claim 8 wherein the RF amplifying device and the MOS sense transistor are both of the LDMOS type.

10. The bias circuit for an RF power amplifier of claim 9 wherein the LDMOS RF amplifying device is fabricated as a ratioed matched pair with the LDMOS sense transistor.

11. A method of biasing an LDMOS RF power transistor having a gate, the LDMOS RF power transistor being used in an RF power amplifier, whereby automatic compensation for temperature and hot-electron degradation is achieved, comprising the steps of:

a) providing an LDMOS sense transistor having a gate;

b) applying a source of power to the LDMOS sense transistor;

c) applying a bias voltage to the gate of the LDMOS sense transistor;

d) monitoring a current through the LDMOS sense transistor;

e) automatically adjusting the bias voltage in response to the current through the LDMOS sense transistor such that the bias voltage moves in the direction that reduces current in the LDMOS sense transistor when this current is above a desired level, and such that the bias voltage moves in the direction that increases current in the LDMOS sense transistor when this current is below the desired level; and f) applying the bias voltage to the gate of the LDMOS RF power transistor.

12. An amplifier comprising:

a power transistor having a gate and a drain;

a sense transistor having a gate and a drain;

a current sensing circuit having an output and coupled to measure a current flow through the drain of the sense transistor;

a bias circuit for generating a bias voltage, the bias voltage being coupled to the gate of the power transistor and to the gate of the sense transistor, the bias circuit having a control input coupled to the output of the current sensing circuit;

circuitry for coupling an input signal to the gate of the power transistor;

circuitry for coupling an output signal from the drain of the power transistor and for coupling power to the power transistor;

circuitry for coupling power to the sense transistor;

wherein the bias circuit is controlled by the output of the current sensing circuit so as to maintain a constant current in the sense transistor, thereby also maintaining a substantially constant quiescent current in the power transistor; and wherein the bias voltage is such that the power transistor operates as a class A amplifier.

13. An amplifier according to claim 1, further comprising:

i) a second power transistor, having a gate and a drain;

j) a second sense transistor having a gate and a drain;

k) circuitry for coupling the input signal to the gate of the second power transistor, such that an AC component of a signal at the gate of the first power transistor is approximately 180-degrees out of phase with an AC component of a signal at the gate of the second power transistor;

l) a second current sensing circuit having an output and coupled to measure a current flow through the drain of the second sense transistor;

m) a second bias circuit for generating a second bias voltage, the second bias voltage being coupled to the gate of the second power transistor and to the gate of the second sense transistor, the second bias circuit having a control input coupled to the output of the second current sensing circuit;

n) circuitry for coupling the output signal from the drain of the second power transistor and for coupling power to the second power transistor; and o) circuitry for coupling power to the second sense transistor;

p) wherein the second bias circuit is controlled by the output of the second current sensing circuit so as to maintain a constant current in the second sense transistor, thereby also maintaining a substantially constant quiescent current in the second power transistor.

14. An amplifier according to claim 13, wherein the first power transistor, the second power transistor, the first sense transistor, and the second sense transistor are of the LDMOS type.

15. An amplifier according to claim 14, wherein the first bias voltage and the second bias voltage are such that the first power transistor and the second power transistor operate as a class AB push-pull amplifier.

16. An amplifier according to claim 14, wherein the first power transistor and first sense transistor are fabricated together on the same die.

17. An amplifier according to claim 16, wherein the second power transistor and second sense transistor are fabricated together on the same die.

* * * * *